United States Patent
Sugimoto

(12) 
(10) Patent No.: US 6,181,571 B1
(45) Date of Patent: Jan. 30, 2001

(54) PRINTED-WIRING BOARD AND ELECTRONIC DEVICE HAVING THE SAME WIRING BOARD

(75) Inventor: Satoshi Sugimoto, Yokohama (JP)

(73) Assignee: Canon Kabushiki Kaisha, Tokyo (JP)

(*) Notice: Under 35 U.S.C. 154(b), the term of this patent shall be extended for 0 days.

(21) Appl. No.: 09/262,928

(22) Filed: Mar. 5, 1999

(30) Foreign Application Priority Data

Mar. 6, 1998 (JP) .................................................. 10-055131
Apr. 15, 1998 (JP) .................................................. 10-105165

(51) Int. Cl.⁷ ...................................................... H05K 7/14
(52) U.S. Cl. ........................... 361/799; 361/752; 361/818; 361/816; 361/803; 174/35 R; 174/51; 174/250; 333/32; 333/181; 333/182
(58) Field of Search ................................... 361/750–752, 361/753, 742, 777, 774, 780, 796, 799, 803, 807, 809, 811, 816, 818; 174/35 R, 51, 250; 333/32, 33, 181, 182; 439/92

(56) References Cited

U.S. PATENT DOCUMENTS

| 4,500,857 | * | 2/1985 | Meyer | 331/117 |
| 5,043,526 | * | 8/1991 | Nakagawa et al. | 174/250 |
| 5,068,631 | * | 11/1991 | Vince | 333/181 |
| 5,140,110 | * | 8/1992 | Nakagawa et al. | 174/250 |
| 5,841,202 | * | 11/1998 | Noguchi et al. | 307/10.1 |
| 6,016,084 | * | 1/2000 | Sugimoto | 333/12 |
| 6,111,474 | * | 8/2000 | Nibe | 333/26 |

FOREIGN PATENT DOCUMENTS 7225634  8/1995  (JP) .

\* cited by examiner

Primary Examiner—Jeffrey Gaffin
Assistant Examiner—Tuan Dinh
(74) Attorney, Agent, or Firm—Fitzpatrick, Cella, Harper & Scinto

(57) ABSTRACT

A printed-wiring board is incorporated into an electronic device housing constructed of a conductive member, and has a ground pattern. A metal plate having a size equal to or larger than the printed-wiring board is disposed in a position facing to the printed-wiring board. The metal plate has a characteristic impedance corresponding to an electric characteristic and a relative position to the printed-wiring board. A connecting member electrically connects the ground pattern of the printed-wiring board to the metal plate, and includes an impedance element having a value substantially equal to the characteristic impedance between the printed-wiring board and the metal plate. An occurrence of radiant noises caused by standing-waves etc. is thereby prevented. A conductive layer having the ground pattern of the printed-wiring board may be connected to another conductive layer provided instead of the metal plate and including a conductive member of which an area is substantially equal to the former conductive layer, with an impedance element interposed between these conductive layers.

24 Claims, 17 Drawing Sheets

PRINTED-WIRING BOARD AND ELECTRONIC DEVICE HAVING THE SAME WIRING BOARD

BACKGROUND OF THE INVENTION

1. Field of the Invention

The present invention relates to a printed-wiring board and an electronic device having the same wiring board, of which a connection structure of the printed-wiring board in the electronic device is contrived to restrain radiant noises out of the electronic device provided with the printed-wiring board.

2. Related Background Art

It has hitherto been conceived preferable that a ground pattern provided on a printed-wiring board be so designed as to reduce fluctuations in electric potential. This intends to restrain an unnecessary current from being generated subsequent to the fluctuations in the ground potential on the wiring board. A first conventional method for this purpose is that the ground on the printed-wiring board might be connected to a box-like conductive member with a less amount of fluctuations in the potential by a screw or soldering or a conductive tape with a low impedance.

When the ground on the printed-wiring board is connected to the box-like conductive member simply through the low impedance, however, standing-waves occur at a given frequency due to the electric current flowing across the wiring board. The standing-waves are defined as intensive electromagnetic waves and might cause a problem of radiant noises in some cases. The above frequency is determined mainly by a higher harmonic frequency of a digital clock, a size of the wiring board, and a dielectric constant of a dielectric member constituting the wiring board.

Further, when connected to the box-like conductive member, there might be a case where the current is easy to flow across a connecting portion therebetween because of this connecting portion having a low impedance. The radiant noises are caused by the current flowing to the box-like conductive member as the case may be.

A second method of restraining the radiant noises caused by the standing-waves is disclosed in Japanese Patent Application Laid-Open No. 7-225634, wherein the connection is made at a plurality of portions which are given a resistivity.

If the box body (housing) shaping a configuration of the device is structured to incorporate two printed-wiring boards 52a, 52b as shown in FIG. 20, however, it might happen that a conductive member 51 of the box body exists in the vicinity of one printed-wiring board 52b, while the box body conductive member 51 facing to the wiring board 52a does not exist in the vicinity of the other printed-wiring board 52a. Further, even when there exists the conductive member 51 facing thereto, this conductive member does not have a sufficient size as compared with the printed-wiring board.

In such a case, even when trying to making the connection at the plurality of portions by use of the second conventional method, it might be impossible to provide the connecting portions in some cases. On the other hand, even if the ground on the wiring board is connected to the conductive member of the box body through an impedance, the standing waves can be restrained. However, this does not lead to stabilization of the ground potential on the wiring board. Namely, if the conductive member of the box body is not in the position facing to the wiring board in the vicinity of the printed-wiring board, it is unfeasible to restrain the radiant noises due to the fluctuations in the ground potential on the printed-wiring board.

Moreover, the ground pattern provided on the printed-wiring board is classified according to applications into those for, e.g., an analog signal and a connection to the box body, and the printed-wiring board is thus designed. Further, a power source pattern provided on the printed-wiring board is also divided corresponding to a drive voltage of a circuit in many cases.

If the ground pattern and the power source pattern exist in mixture as described above, the wiring and component layout designed on the printed-wiring board become intricate, and the ground on the wiring board and the conductive member of the box body are connected to each other in an optimal position with a difficulty.

SUMMARY OF THE INVENTION

It is a primary object of the present invention, which obviates the problems described above, to provide a printed-wiring board and an electronic device having the printed-wiring board which are capable of stabilizing a ground potential on the printed-wiring board and restraining an occurrence of radiant noises.

It is another object of the present invention to provide a structure capable of restraining the radiant noses by providing a metal plate having a size equal to or larger than the printed-wiring board in a position facing to the surface of the printed-wiring board, and connecting the ground pattern on the printed-wiring board to the metal plate with a predetermined impedance.

It is a further object of the present invention to provide a structure capable of restraining the radiant noises by providing a second conductive layer having a conductive pattern substantially over an entire surface with respect to a first conductive layer having the ground pattern, and connecting the ground pattern of the first conductive layer to the second conductive layer with a predetermined impedance.

These together with other objects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENTS

Embodiments of the present invention will hereinafter be described with reference to the accompanying drawings.

To start with, a first embodiment of the present invention will be explained. An electronic device to be dealt with in the first embodiment takes a box-like structure in which a box-like conductive member facing to a printed-wiring board does not exist in the vicinity of the printed-wiring board, and, even if the conductive member facing thereto exists, a size of this conductive member is not sufficient as compared with the printed-wiring board.

Figure 1:
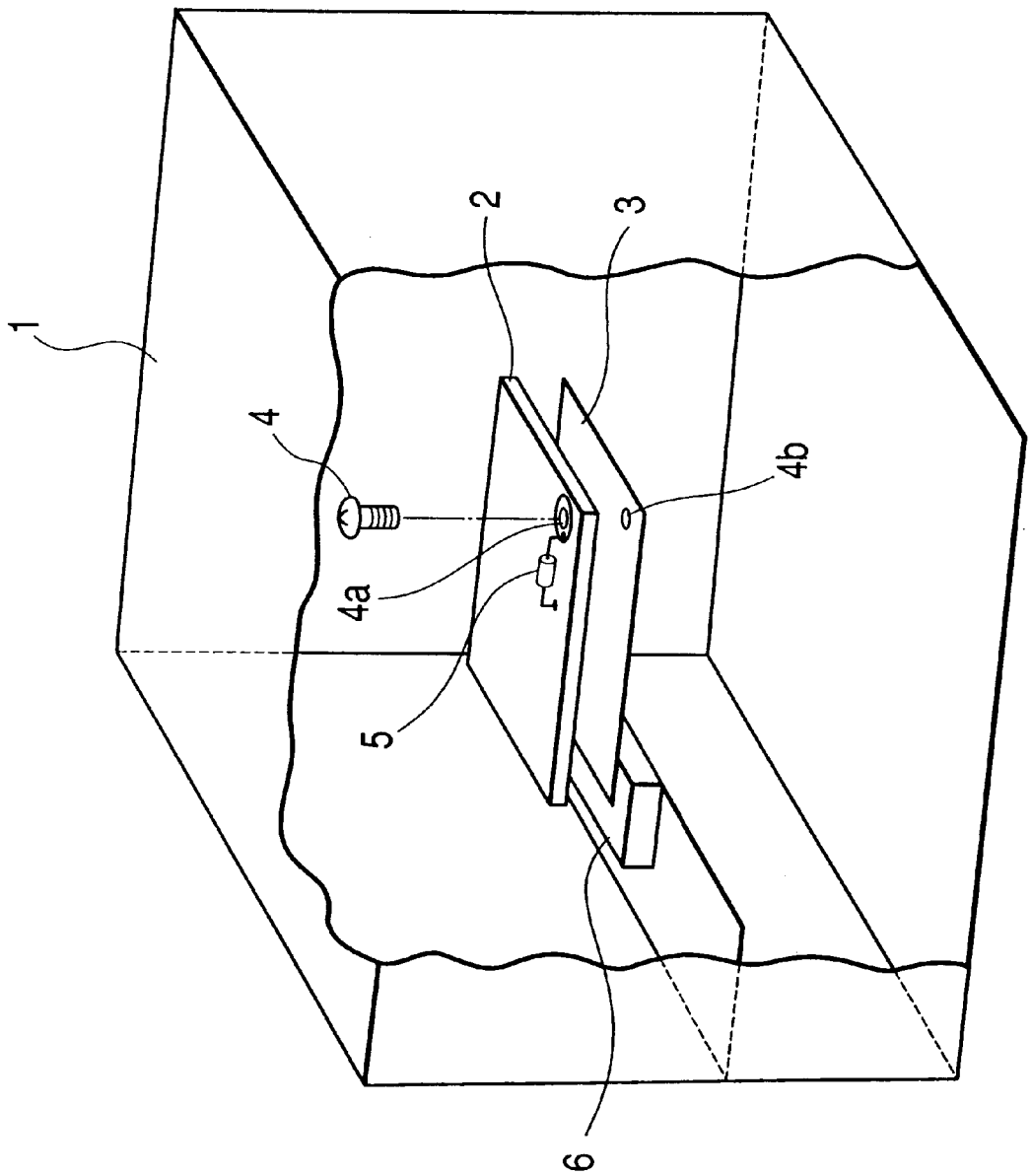
FIG. 1 is a perspective view schematically showing an electronic device having a printed-wiring board in a first example of a first embodiment of the present invention.

FIG. 1 is a perspective view schematically illustrating the electronic device including the printed-wiring board in a first example of a first embodiment of the present invention. Referring to FIG. 1, a part of the box body is cut off to make an interior of the electronic device visible.

Referring again to FIG. 1, a printed-wiring board 2 is disposed within a box-like conductive member 1 constituting the electronic device. A metal plate 3, of which a size is equal to that of the printed-wiring board 2, is disposed under the printed-wiring board 2. The metal plate 3 is fixed through a non-conductive member 6 to the box-like conductive member 1, and there is no electric connection between the metal plate 3 and the box-like conductive member 1. One ends of the printed-wiring board 2 and of the metal plate 3 are formed with screw holes 4a, 4b through which the printed-wiring board 2 and the metal plate 3 are electrically connected to each other with a screw 4.

Figure 2:
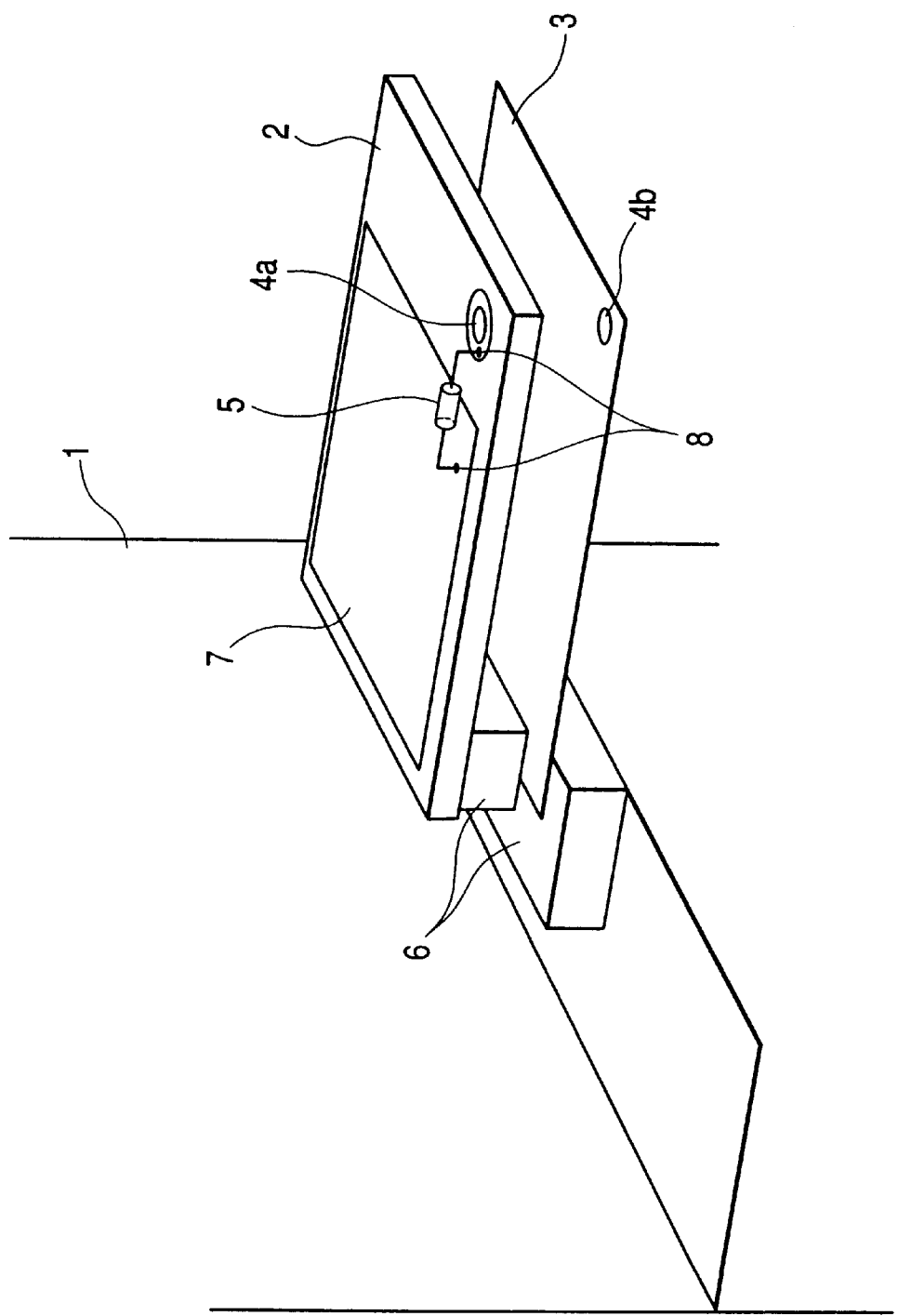
FIG. 2 is an enlarged perspective view showing a portion in the vicinity of a connecting portion between the printed-wiring board and a metal plate within the electronic device shown in FIG. 1.

FIG. 2 is an enlarged perspective view showing a portion in the vicinity of the connecting portion of the printed-wiring board 2. Through-hole lands 8 capable of being packaged with a lead type electronic component 5 are formed in a part of the screw hole 4 and a part of the ground pattern 7 on the printed-wiring board 2. The lead type electronic component 5 having an impedance is inserted in the through-hole lands 8, whereby the ground pattern 7 is electrically connected to the screw hole 4a of the printed-wiring board 2. Further, the screw hole 4a of the printed-wiring board 2 is connected to the screw hole 4b of the metal plate 3 with a screw (not shown) exhibiting an electric conductivity. With the structure described above, the ground pattern 7 on the printed-wiring board 2 is electrically connected to the metal plate 3 through the lead type electronic component 5 exhibiting the impedance on the printed wiring board 2. Namely, the ground pattern 7 on the printed-wiring board 2 is connected to the metal plate 3 with a predetermined impedance.

Further, at the other end of the printed-wiring board 2, the printed-wiring plate 2, the metal plate 3 and the conductive member 1 of the box body are fixed through the non-conductive member 6 in an electrically non-conductive state.

Note that the ground pattern 7 formed on the printed-wiring board 2 shown in FIG. 2 is schematically depicted, and there may be arbitrary through-areas for other wiring patterns and wiring layers to be wired. Further, portions at which the ground pattern 7 on the printed-wiring board 2 is connected to the metal plate 3, may be set in arbitrary or a plurality of positions on the printed-wiring board 2 and the metal plate 3. Moreover, there may differ respective impedances of the connecting portions in the case of a plurality of connections.

Figure 3:
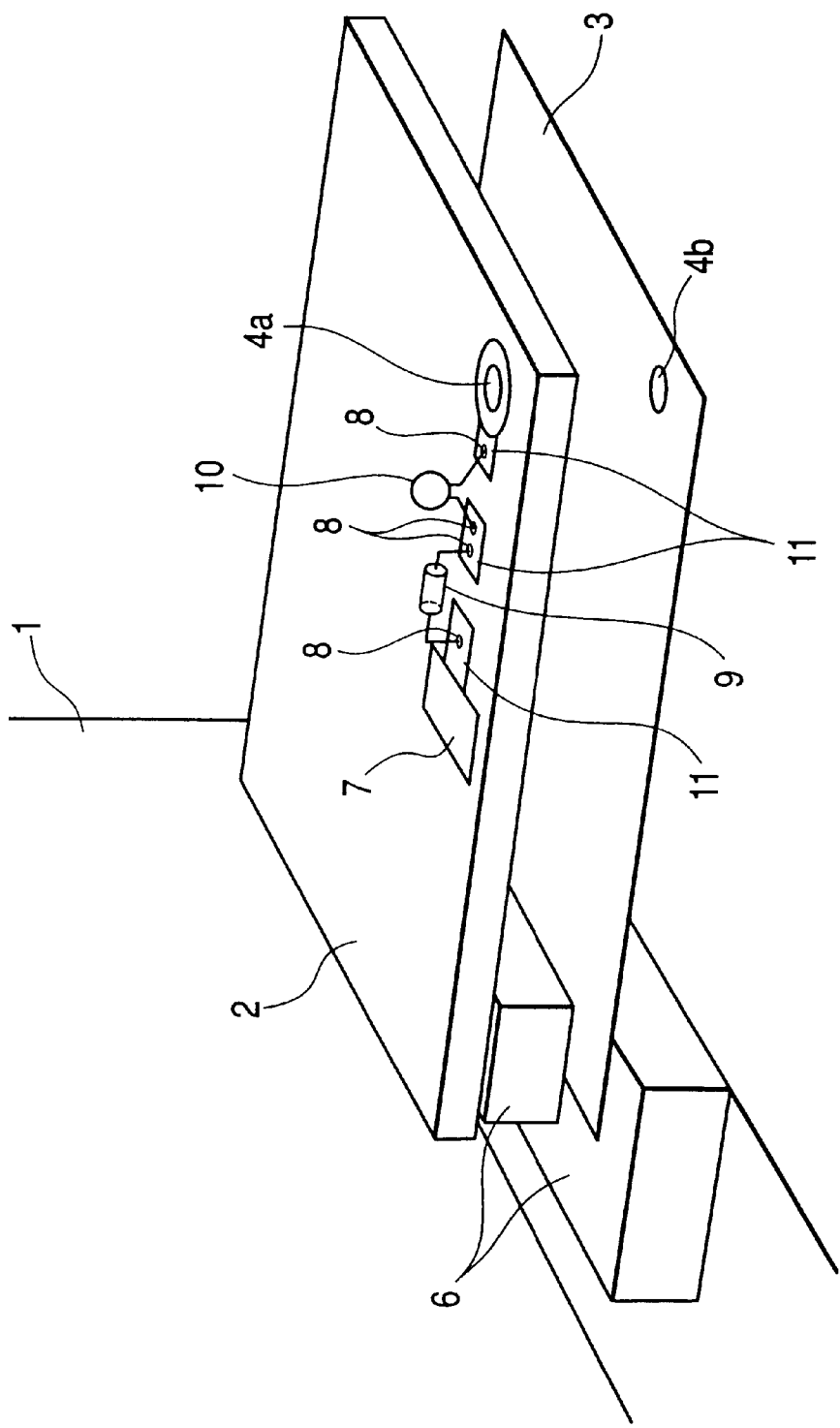
FIG. 3 is a perspective view showing a portion in the vicinity of the connecting portion between the printed-wiring board and the metal plate within the electronic device in a second example of the first embodiment of the present invention.

FIG. 3 is a perspective view showing a portion in the vicinity of the connecting portion at which the printed-wiring board is connected to the metal plate within the electronic device in a second example of the first embodiment of the present invention.

Referring to FIG. 3, one end of the printed-wiring board 2 is formed with a screw hole 4a through which the ground pattern 7 provided in the wiring board 2 is connected to the metal plate 3. Further, a connection conductive pattern 11 mounted with a lead type resistance component 9 and a lead type capacitor component 10 in series, is provided between the screw hole 4a and the ground pattern 7 of the printed-wiring board 2. Then, the conductive pattern 11 is provided with the through-hole lands 8 through which the lead type resistance component 9 and the lead type capacitor component 10 are inserted. The lead type resistance component 9 and the lead type capacitor component 10 are inserted into the through-hole lands 8 and connected thereto by a method such as soldering etc.

Moreover, the metal plate 3 is also formed with the screw hole 4b, and the screw hole 4a in the printed-wiring board 2 is connected to the screw hole 4b in the metal plate 3 with a screw (unillustrated) exhibiting an electric conductivity. With this structure, the ground pattern 7 on the printed-wiring board 2 is electrically connected to the metal plate 3 via the lead type resistance component 9 and the capacitor component 10 which are connected in series on the printed-wiring board 2. The ground pattern 7 on the printed-wiring board 2 and the metal plate 3 are connected to each other likewise with a predetermined impedance.

Further, at the other end of the printed-wiring board 2, the printed-wiring plate 2, the metal plate 3 and the conductive member 1 of the box body are fixed through the non-conductive member 6 in the electrically non-conductive state.

It is to be noted that the lead type resistance component and the capacitor component are so used as to be combined in series in the second example of the first embodiment, however, a conductive pattern provided for connection is provided with a surface packaging land, and a chip type electronic component may also be used. Furthermore, elements exhibiting an inductance may also be combined, and the number of elements to be combined may be plural.

Figure 4:
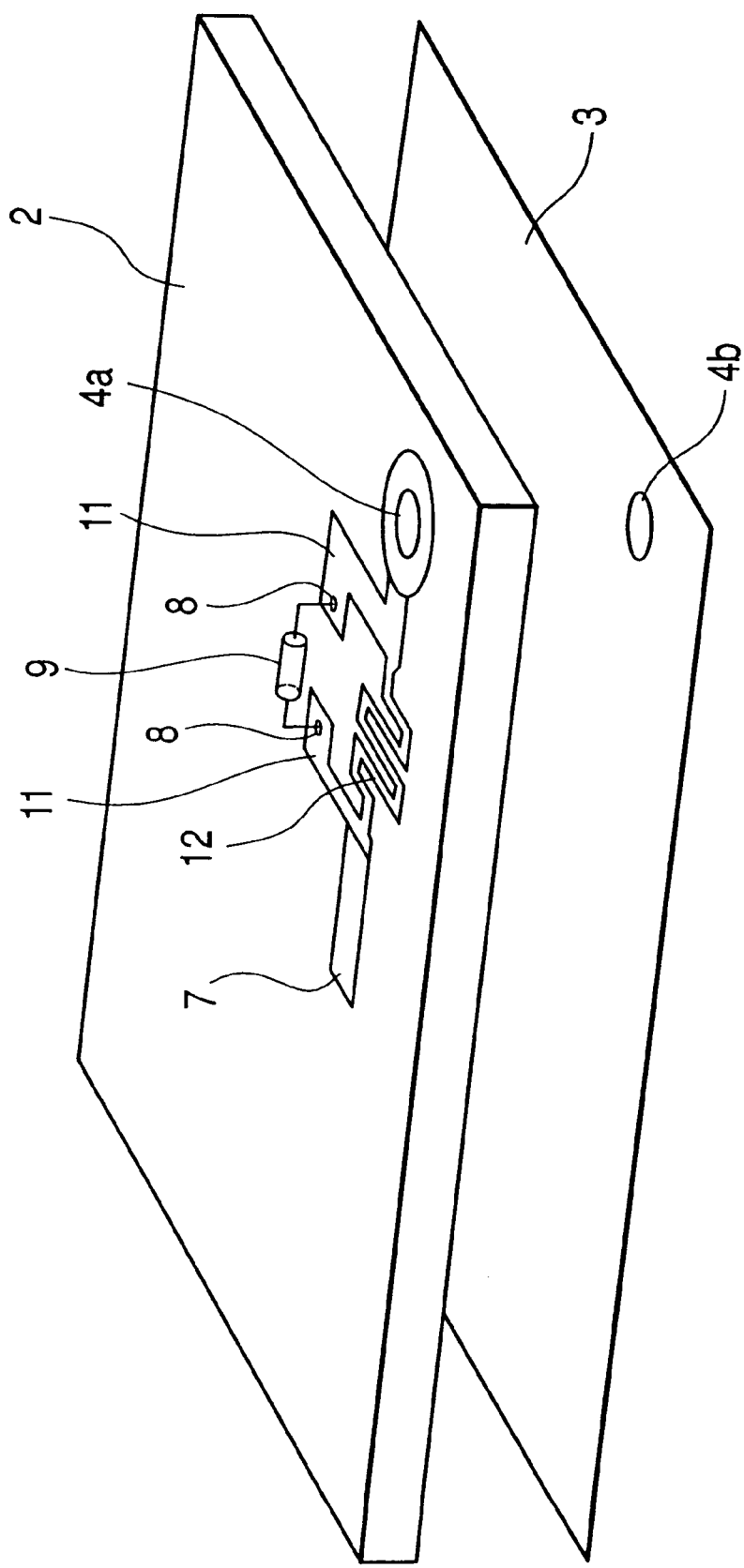
FIG. 4 is a perspective view showing a portion in the vicinity of the connecting portion between the printed-wiring board and the metal plate within the electronic device in a third example of the first embodiment of the present invention.

FIG. 4 is a perspective view showing a portion in the vicinity of the connecting portion at which the printed-wiring board is connected to the metal plate within the electronic device in a third example of the first embodiment of the present invention.

In the second example of the first embodiment, the lead type resistance component and the lead type capacitor component are combined in series, and a certain predetermined impedance is given to the connecting portion between the newly provided metal plate and the ground pattern on the printed-wiring board. By contrast, according to the third example of the first embodiment, a print inductor and the lead type resistance component are combined in parallel, and the connecting portion described above is given a certain predetermined impedance. The following is an explanation which will be made in a specific manner.

Referring to FIG. 4, one end of the printed-wiring board 2 is formed with the screw hole 4a through which the ground pattern 7 on the wiring board 2 is connected to the metal plate 3. Further, the connection conductive patterns 11 mounted with the lead type resistance component 9, are provided respectively at the screw hole 4a and the ground pattern 7 of the printed-wiring board 2. Then, each conductive pattern 11 is provided with the through-hole land 8. The lead type resistance component 9 is inserted into the through-hole lands 8, and the through-hole lands 8 are connected to leads of the lead type resistance component 9 by a method such as soldering etc. The ground pattern 7 is thereby electrically connected to the screw hole 4a in the printed-wiring board 2.

Moreover, a crooked conductive pattern 12 is separately provided in parallel to the lead type resistance component 9 between the screw hole 4a and the ground pattern 7 on the printed-wiring board 2, whereby the ground pattern 7 is connected to the screw hole 4a.

Further, the metal plate 3 is also formed with the screw hole 4b, and the screw hole 4a in the printed-wiring board 2 is connected to the screw hole 4b in the metal plate 3 with a screw (unillustrated) exhibiting an electric conductivity. With this structure, the ground pattern 7 on the printed-wiring board 2 is electrically connected to the metal plate 3 via the lead type resistance component 9 and the crooked conductive pattern 12 which are connected in parallel on the printed-wiring board 2.

Moreover, at the other end of the printed-wiring board 2, the printed-wiring plate 2, the metal plate 3 and the conductive member 1 of the box body are fixed through the non-conductive member 6 in the electrically non-conductive state. In FIG. 4, however, there are omitted the conductive member 1 of the box body and the non-conductive member 6 at the other end of the printed-wiring board 2.

With such a construction, there can be attained the structure of connecting in parallel the ground pattern 7 on the printed-wiring board 2 and the newly provided metal plate 3 can be structured to connect a plurality of impedances in parallel.

Figures 5A, 5B:
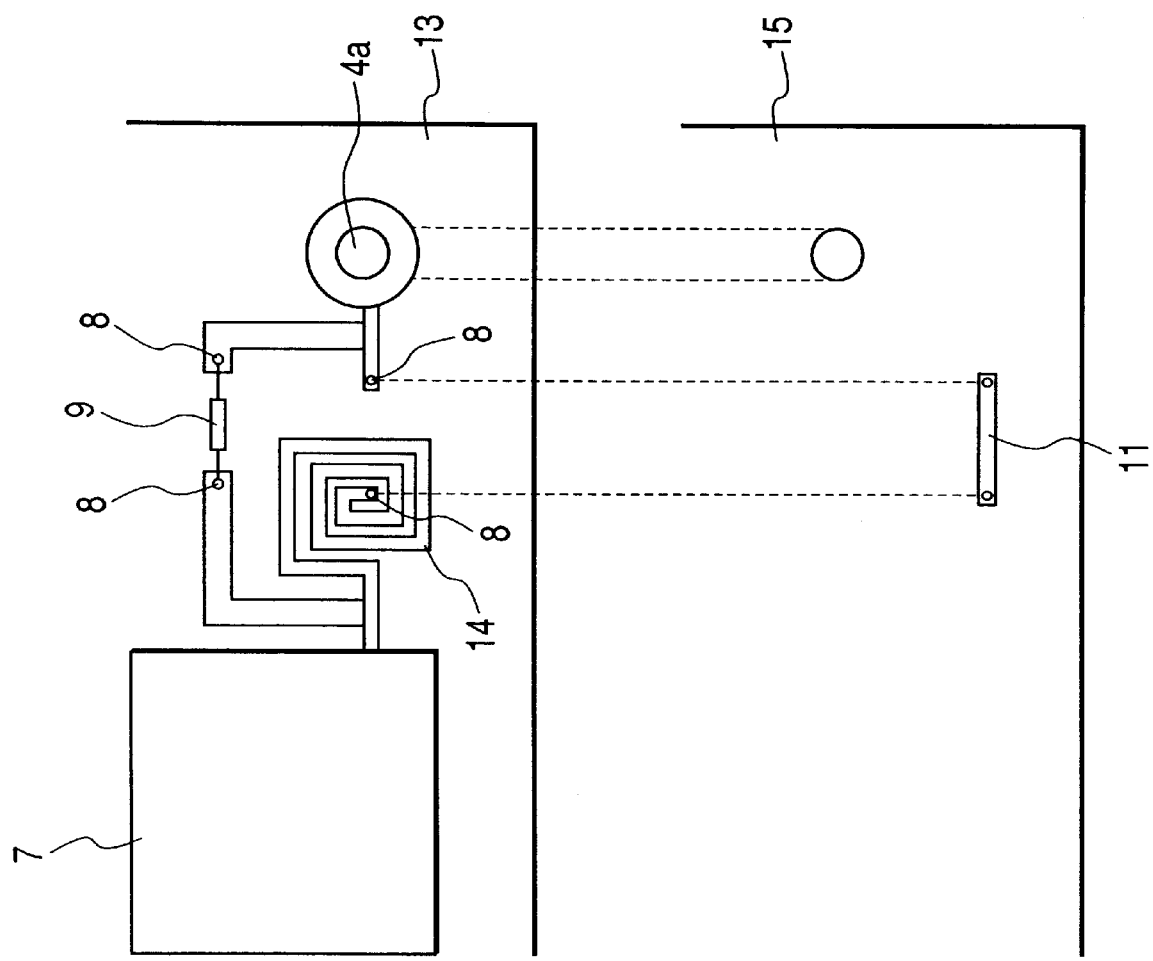
FIGS. 5A and 5B are perspective views showing a portion in the vicinity of the connecting portion between the printed-wiring board and the metal plate within the electronic device in a modification of the third example of the first embodiment of the present invention.

Further, as shown in FIGS. 5A and 5B, a print inductor using a spiral conductive pattern as a substitute for the crooked conductive pattern, may also be used. FIGS. 5A and 5B are top views of the portion in the vicinity of the connecting portion of the printed-wiring board having the print inductor as described above as viewed per wiring layer. FIG. 5A shows a first wiring layer in the case of a multi-layered printed-wiring board. FIG. 5B shows a second wiring layer. Namely, the first wiring layer 13 shown in FIG. 5A has the spiral conductive pattern 14 separately provided in parallel with the lead type resistance component 9 between the screw hole 4a and the ground pattern 7 on the printed-wiring board 2. On the other hand, the second wiring layer 15 shown in FIG. 5B is formed with the conductive pattern 11, and the spiral conductive pattern 13 on the first wiring layer 13 is electrically connected to the screw hole 4a through a through-hole (indicated by the dotted line in FIGS. 5A and 5B) and the conductive pattern 11 as well.

Figure 6:
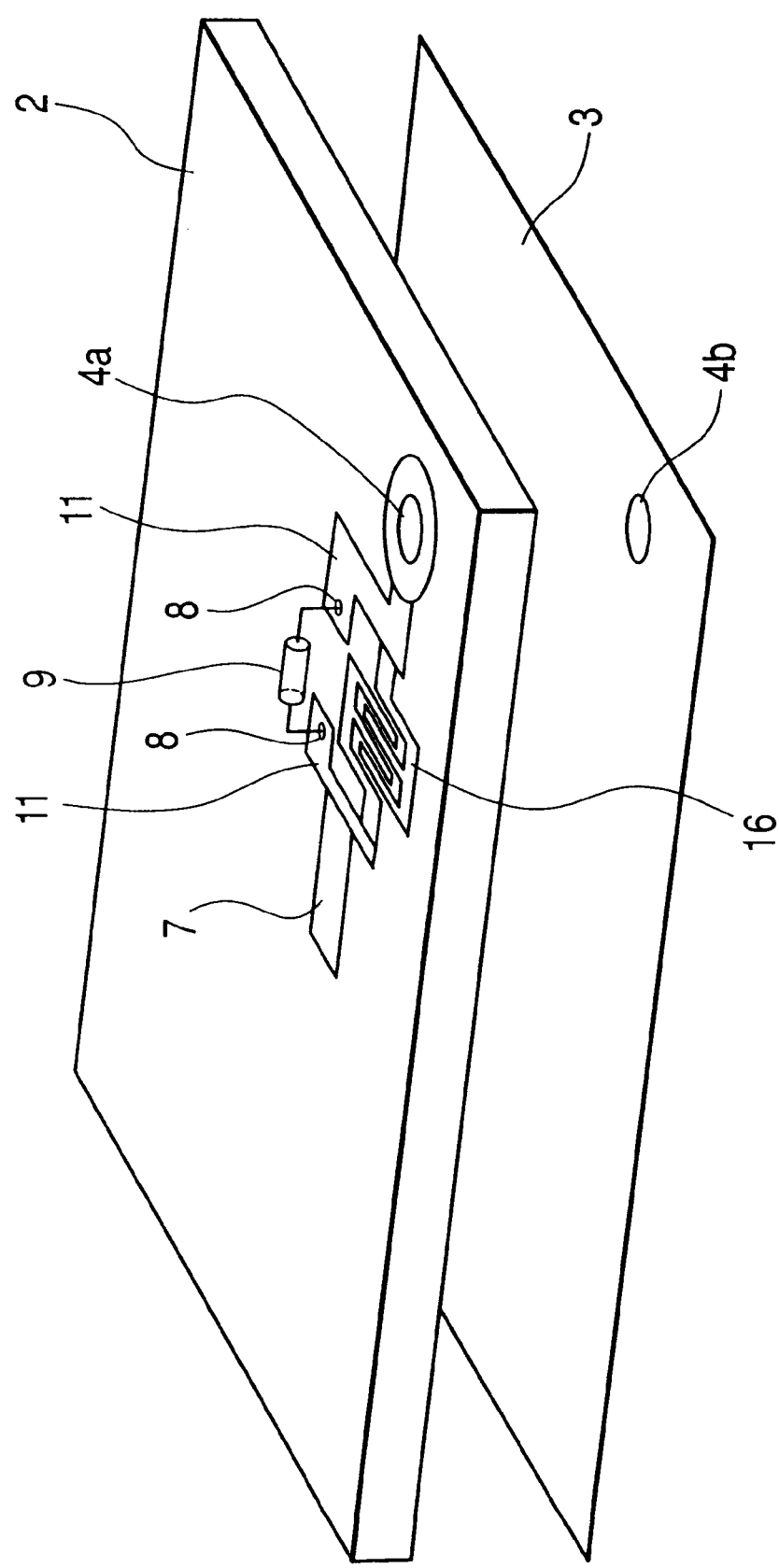
FIG. 6 is a perspective view showing a portion in the vicinity of the connecting portion between the printed-wiring board and the metal plate within the electronic device in a fourth example of the first embodiment of the present invention.

FIG. 6 is a perspective view showing a portion in the vicinity of the connecting portion at which the printed-wiring board is connected to the metal plate within the electronic device in a fourth example of the first embodiment of the present invention.

The third example of the first embodiment involves the use of the print inductor. The fourth example of the first embodiment, however, exemplifies a case where the connecting portion is given a capacitive property by a print capacitor assuming a comb-like configuration.

Referring to FIG. 6, one end of the printed-wiring board 2 is formed with the screw hole 4a through which the ground pattern 7 on the wiring board 2 is connected to the metal plate 3. Further, the connection conductive patterns 11 mounted with the lead type resistance component 9, are provided respectively at the screw hole 4a and the ground pattern 7 of the printed-wiring board 2. Then, each conductive pattern 11 is provided with the through-hole land 8. The lead type resistance component 9 is inserted into the through-hole lands 8, and the through-hole lands 8 are connected to leads of the lead type resistance component 9 by a method such as soldering etc. The ground pattern 7 is thereby electrically connected to the screw hole 4a in the printed-wiring board 2.

Moreover, a comb-like conductive pattern 16 is separately provided in parallel to the lead type resistance component 9 between the screw hole 4a and the ground pattern 7 on the printed-wiring board 2, whereby the ground pattern 7 is connected to the screw hole 4a.

Further, the metal plate 3 is also formed with the screw hole 4b, and the screw hole 4a in the printed-wiring board 2 is connected to the screw hole 4b in the metal plate 3 with a screw (unillustrated) exhibiting an electric conductivity. With this structure, the ground pattern 7 on the printed-wiring board 2 is electrically connected to the metal plate 3 via the lead type resistance component 9 and the comb-like conductive pattern 16 which are connected in parallel on the printed-wiring board 2. The ground pattern 7 on the printed-wiring board 2 and the metal plate 3 are connected to each other likewise with a predetermined impedance.

Moreover, at the other end of the printed-wiring board 2, the printed-wiring plate 2, the metal plate 3 and the conductive member 1 of the box body are fixed through the non-conductive member 6 in the electrically non-conductive state. In FIG. 6, however, there are omitted the conductive member 1 of the box body and the non-conductive member 6 at the other end of the printed-wiring board 2.

With such a construction, the ground pattern 7 on the printed-wiring board 2 and the newly provided metal plate 3 can be so structured as to be connected with the resistive and capacitive properties in parallel.

Figure 7:
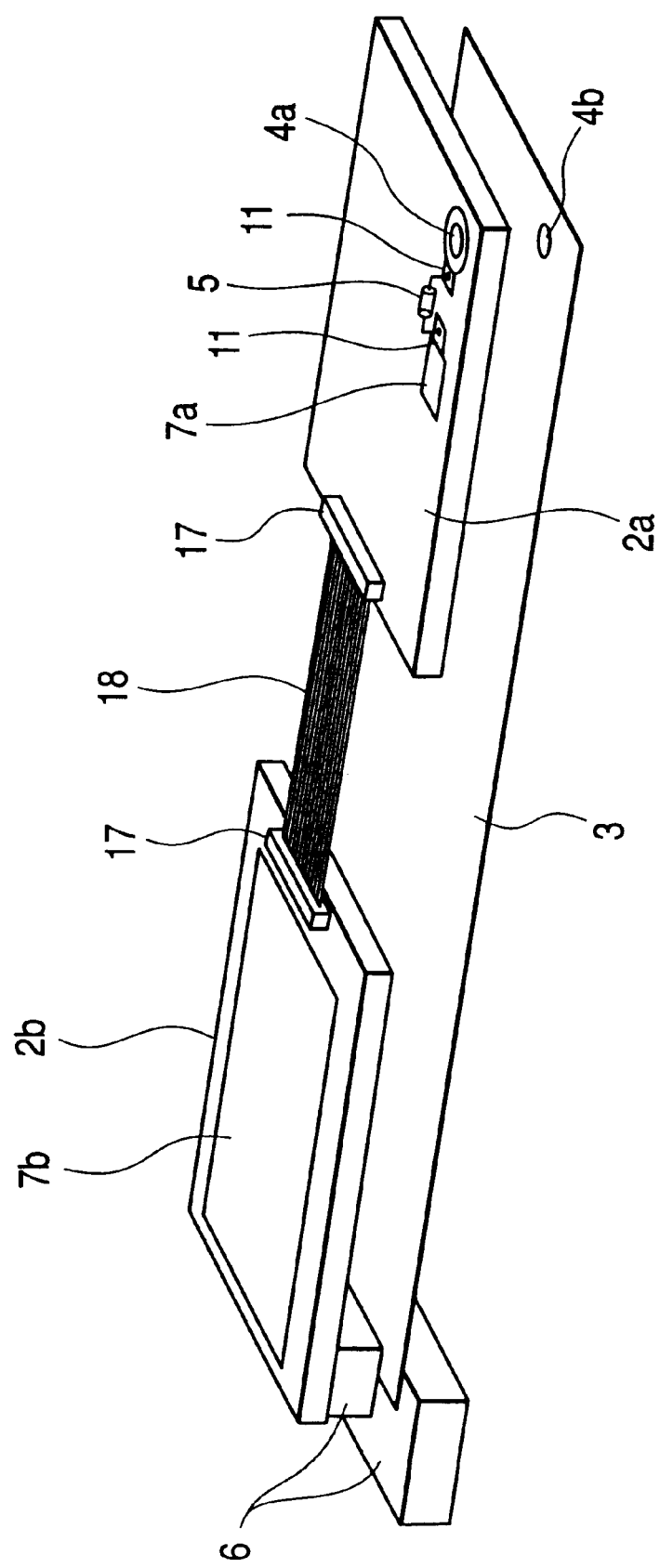
FIG. 7 is a perspective view showing a portion in the vicinity of the connecting portion between the printed-wiring board and the metal plate within the electronic device in a fifth example of the first embodiment of the present invention.

FIG. 7 is a perspective view showing a portion in the vicinity of the connecting portion at which the printed-wiring board is connected to the metal plate within the electronic device in a fifth example of the first embodiment of the present invention.

Figure 8:
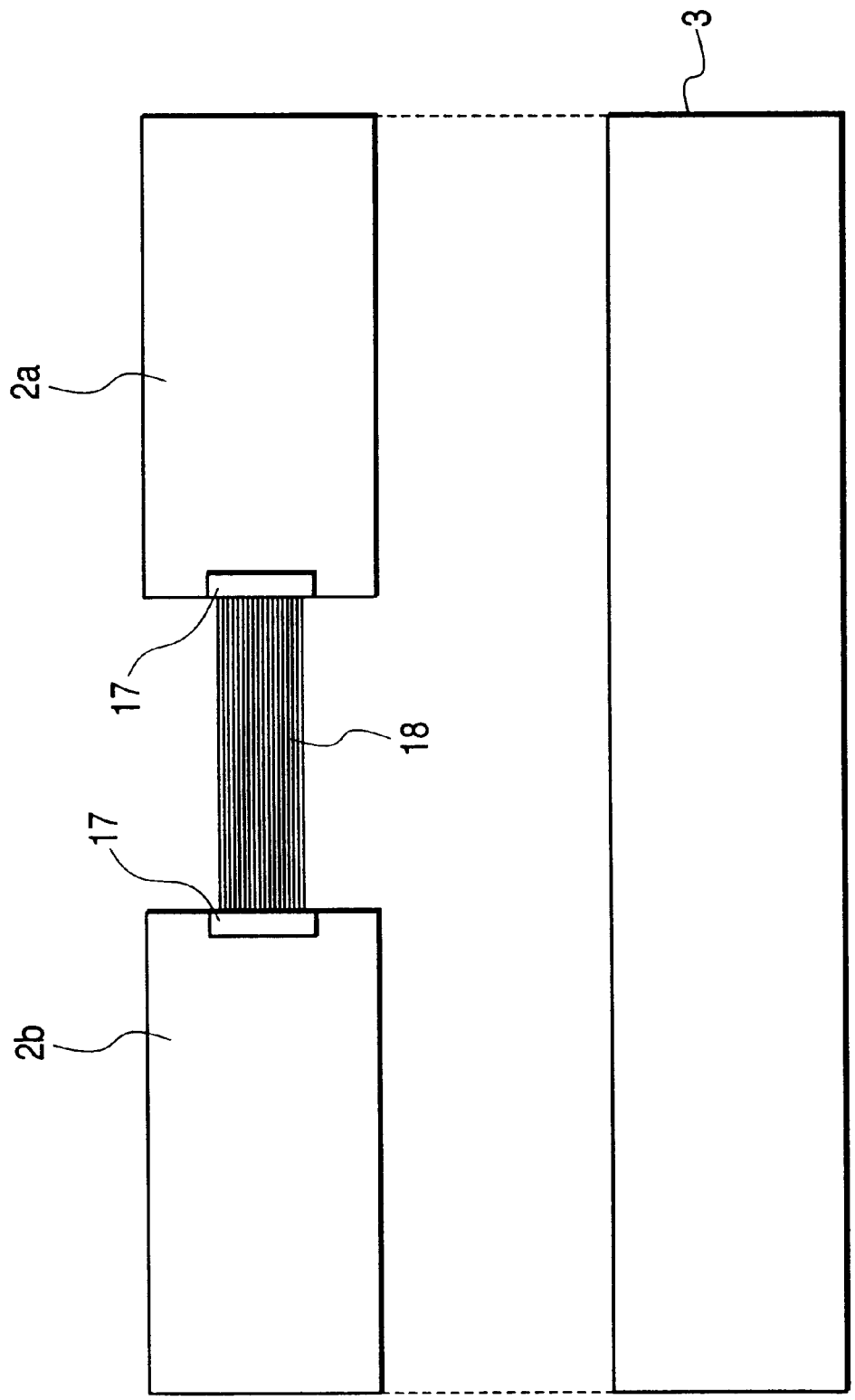
FIG. 8 is an explanatory plan view showing a relationship in size between two printed-wiring boards connected via a cable to the metal plate shown in FIG. 7.

Referring to FIG. 7, printed-wiring boards 2a, 2b are connected to each other through connectors and a cable 18. Then, the metal plate 3, of which a size is equal to a plane area occupied by the printed-wiring boards 2a, 2b and the cable 18, is disposed in a position facing to both of the printed-wiring boards. Herein, what is meant by "a size is equal" is that the metal plate 3 has the size substantially equal to the plane area embracing the printed-wiring boards 2a, 2b and the cable 18 when the printed-wiring board 2a is, as shown in FIG. 8, connected via the cable 18 to the printed-wiring board 2b.

Further, one end of the printed-wiring board 2a is formed with the screw hole 4a through which a ground pattern 7a on the wiring board 2a is connected to the metal plate 3. Furthermore, the connection conductive patterns 11 mounted with the lead type electronic component 5, are provided respectively at the screw hole 4a and the ground pattern 7a of the printed-wiring board 2a. The leads of the lead type electronic component 5 are connected to the conductive patterns 11 by a method such as soldering etc. The ground pattern 7a is thereby electrically connected to the screw hole 4a in the printed-wiring board 2a.

Moreover, the metal plate 3 is also formed with the screw hole 4b, and the screw hole 4a in the printed-wiring board 2a is connected to the screw hole 4b in the metal plate 3 with a screw (unillustrated) exhibiting the electric conductivity. With this structure, the ground pattern 7a on the printed-wiring board 2a is electrically connected to the metal plate 3 via the lead type electronic component 5.

Moreover, at the other end of the printed-wiring board 2b, the printed-wiring plate 2, the metal plate 3 and the conductive member 1 of the box body are fixed through the non-conductive member 6 in the electrically non-conductive state. In FIG. 7, however, the conductive member 1 of the box body is omitted.

With such a construction, when the plurality of printed-wiring boards are connected by the cable, the ground pattern on the printed-wiring board and the newly provided metal plate can be so structured as to be connected through the impedance. The ground pattern 7 on the printed-wiring board 2 and the metal plate 3 are connected to each other likewise with a predetermined impedance.

Figure 9:
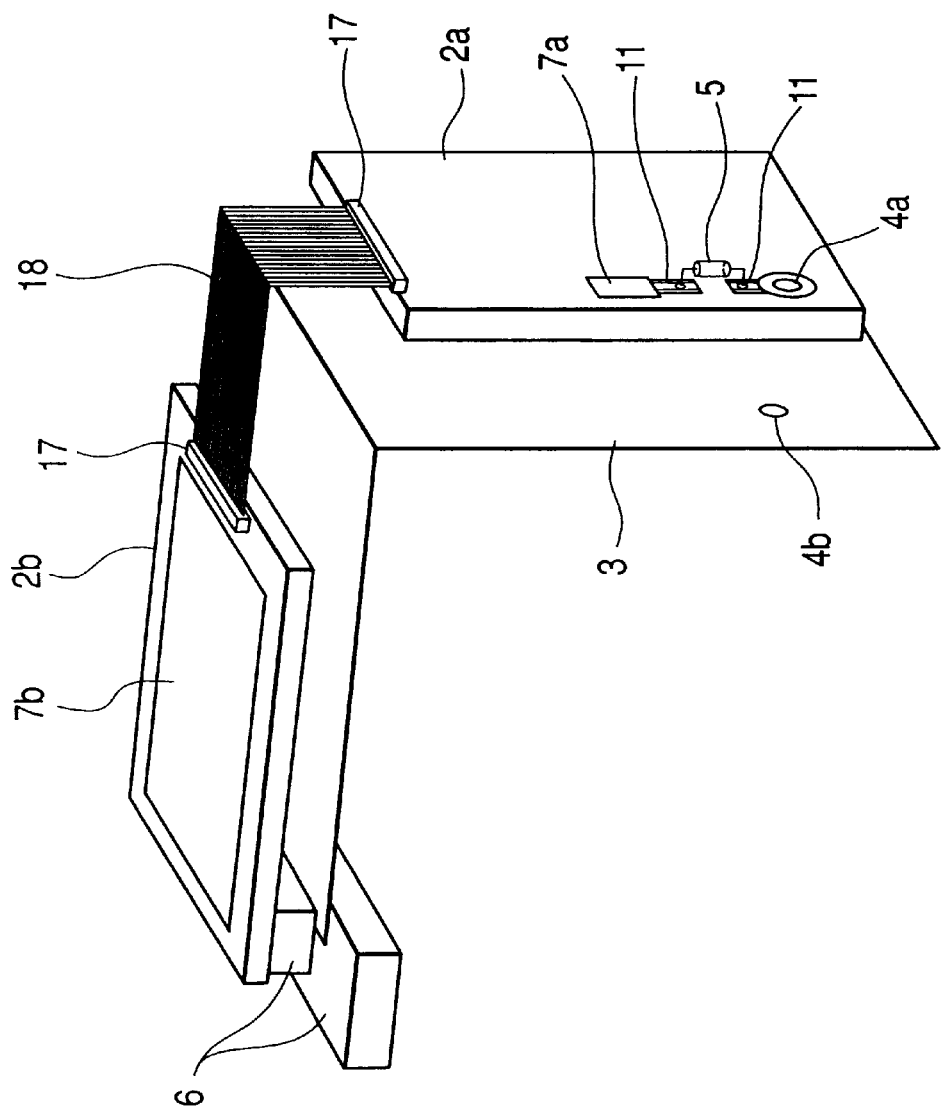
FIG. 9 is a perspective view showing a portion in the vicinity of the connecting portion between the printed-wiring board and the metal plate within the electronic device in a sixth example of the first embodiment of the present invention.

FIG. 9 is a perspective view showing a portion in the vicinity of the connecting portion at which the printed-wiring board is connected to the metal plate within the electronic device in a sixth example of the first embodiment of the present invention.

In the fifth example of the first embodiment, the two printed-wiring boards and the cable are disposed within the same plane. The sixth example, however, exemplifies a case where the two printed-wiring boards are disposed on planes different from each other.

The printed-wiring boards 2a, 2b shown in FIG. 9 are disposed on the planes perpendicular to each other and connected to each other through the connectors and the cable 18. Then, the metal plate 3 bent at a right angle is disposed in a position facing to both of the printed-wiring boards 2a, 2b. The metal plate 3 has a size which is equal to an area embracing the printed-wiring boards 2a, 2b and the cable 18 when the printed-wiring board 2a is connected via the cable 18 to the printed-wiring board 2b.

Further, one end of the printed-wiring board 2a is formed with the screw hole 4a through which the ground pattern 7a on the wiring board 2a is connected to the metal plate 3. Furthermore, the connection conductive patterns 11 mounted with the lead type electronic component 5, are provided respectively at the screw hole 4a and the ground pattern 7a of the printed-wiring board 2a. The leads of the lead type electronic component 5 are connected to the conductive patterns 11 by a method such as soldering etc. The ground pattern 7a is thereby electrically connected to the screw hole 4a in the printed-wiring board 2a.

Moreover, the metal plate 3 is also formed with the screw hole 4b, and the screw hole 4a in the printed-wiring board 2a is connected to the screw hole 4b in the metal plate 3 with a screw (unillustrated) exhibiting the electric conductivity. With this structure, the ground pattern 7a on the printed-wiring board 2a is electrically connected to the metal plate 3 via the lead type electronic component 5. The ground pattern 7 on the printed-wiring board 2 and the metal plate 3 are connected to each other likewise with a predetermined impedance.

Moreover, at the other end of the printed-wiring board 2b, the printed-wiring plate 2, the metal plate 3 and the conductive member 1 of the box body are fixed through the non-conductive member 6 in the electrically non-conductive state. In FIG. 9, however, the conductive member 1 of the box body is omitted.

With such a construction, when the plurality of printed-wiring boards connected by the cable do not exist on the same plane, the ground pattern on the printed-wiring board and the newly provided metal plate can be so structured as to be connected through the impedance.

Figure 10:
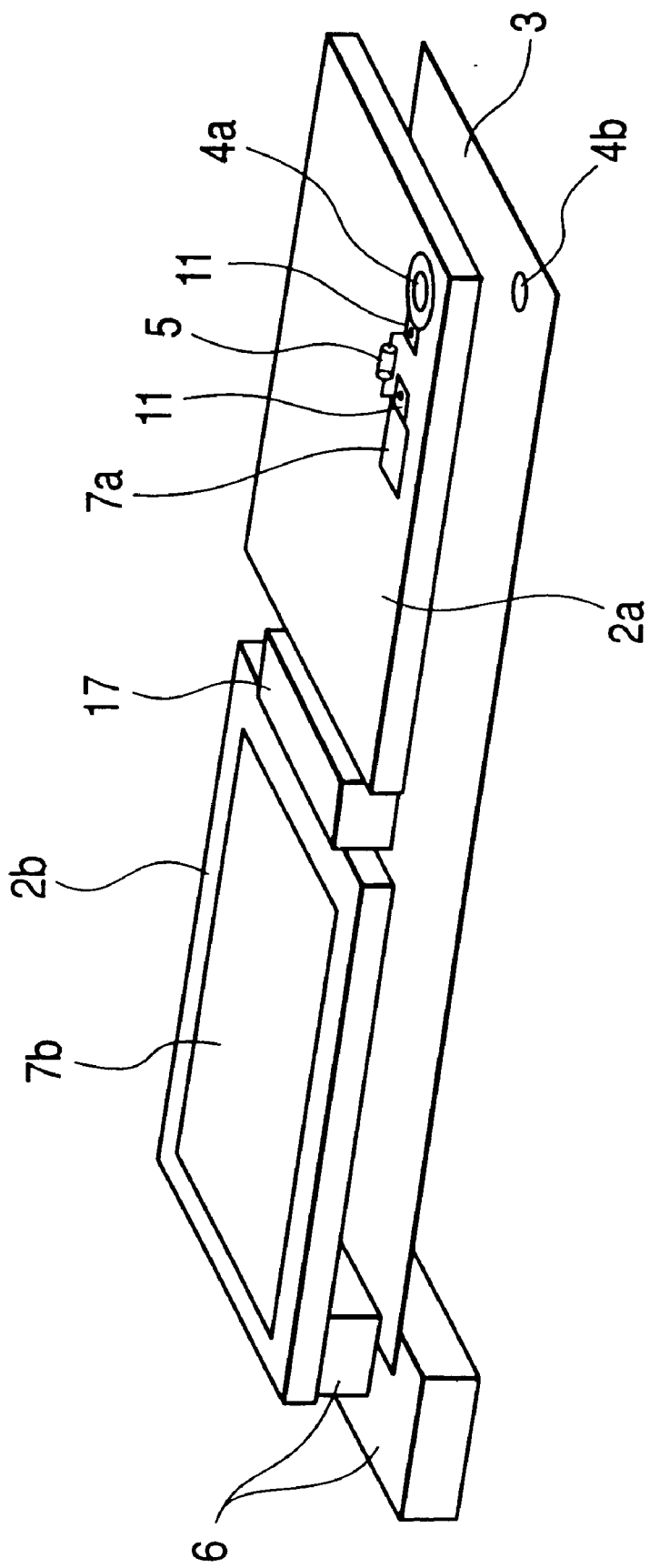
FIG. 10 is a perspective view showing a portion in the vicinity of the connecting portion between the printed-wiring board and the metal plate within the electronic device in a seventh example of the first embodiment of the present invention.

FIG. 10 is a perspective view showing a portion in the vicinity of the connecting portion at which the printed-wiring board is connected to the metal plate within the electronic device in a seventh example of the first embodiment of the present invention.

In the fifth example of the first embodiment, the two printed-wiring boards are connected by the cable. The seventh example, however, exemplifies a case where the two printed-wiring boards are connected by only the connector. Then, the metal plate 3, of which a size is equal to a plane area occupied by the printed-wiring boards 2a, 2b and the connector 17, is disposed in a position facing to both of the printed-wiring boards 2a, 2b.

Further, one end of the printed-wiring board 2a is formed with the screw hole 4a through which the ground pattern 7a provided on the wiring board 2a is connected to the metal plate 3. Furthermore, the connection conductive patterns 11 mounted with the lead type electronic component 5, are provided respectively at the screw hole 4a and the ground pattern 7a of the printed-wiring board 2a. The leads of the lead type electronic component 5 are connected to the conductive patterns 11 by a method such as soldering etc. The ground pattern 7a is thereby electrically connected to the screw hole 4a in the printed-wiring board 2a.

Moreover, the metal plate 3 is also formed with the screw hole 4b, and the screw hole 4a in the printed-wiring board 2a is connected to the screw hole 4b in the metal plate 3 with a screw (unillustrated) exhibiting the electric conductivity. With this structure, the ground pattern 7a on the printed-wiring board 2a is electrically connected to the metal plate 3 via the lead type electronic component 5. The ground pattern 7 on the printed-wiring board 2 and the metal plate 3 are connected to each other likewise with a predetermined impedance.

Moreover, at the other end of the printed-wiring board 2b, the printed-wiring plate 2, the metal plate 3 and the conductive member 1 of the box body are fixed through the non-conductive member 6 in the electrically non-conductive state. In FIG. 10, however, the conductive member 1 of the box body is omitted.

With such a construction, the ground patterns on the plurality of printed-wiring boards connected by only the connector and the newly provided metal plate can be so structured as to be connected through the impedance.

Figure 11:
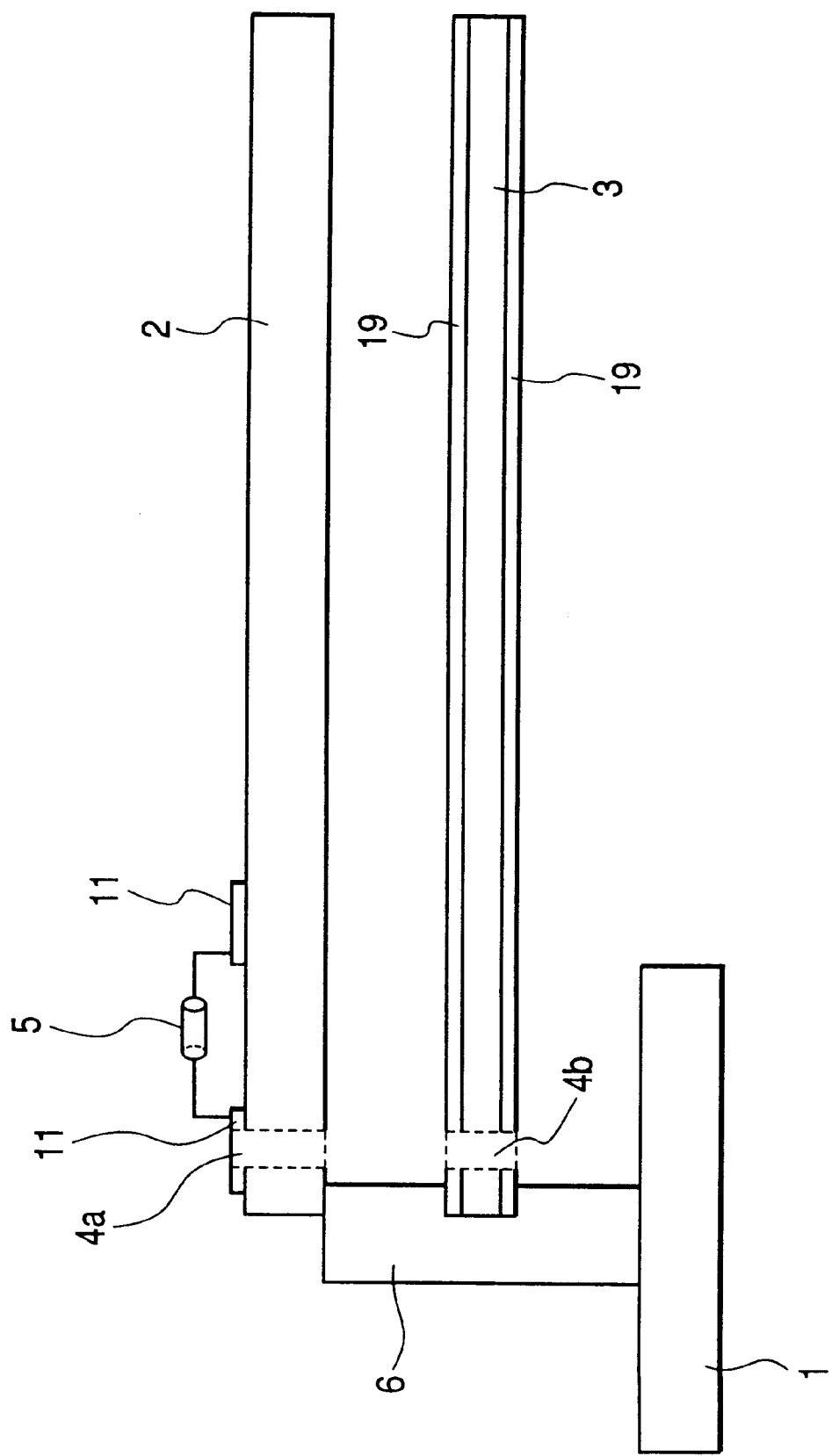
FIG. 11 is a perspective view showing a portion in the vicinity of the connecting portion between the printed-wiring board and the metal plate within the electronic device in an eighth example of the first embodiment of the present invention.

FIG. 11 is a perspective view showing a portion in the vicinity of the connecting portion at which the printed-wiring board is connected to the metal plate within the electronic device in an eighth example of the first embodiment of the present invention.

Referring to FIG. 11, the metal plate 3 having a size equal to that of the printed-wiring board 2 and covered with a dielectric member 19, is disposed in a position facing to the printed-wiring board 2. Further, in the fifth example of the first embodiment, the two printed-wiring boards are connected by the cable. The seventh example, however, exemplifies a case where the two printed-wiring boards are connected by only the connector. Then, the metal plate 3, of which a size is equal to a plane area occupied by the printed-wiring boards 2a, 2b and the connector 17, is disposed in a position facing to the printed-wiring board 2. Further, one end of the printed-wiring board 2 is formed with the screw hole 4a through which the ground pattern (not shown) provided on the wiring board 2 is connected to the metal plate 3. Furthermore, the connection conductive patterns 11 mounted with the lead type electronic component 5, are provided respectively at the screw hole 4a and the ground pattern (not shown) of the printed-wiring board 2. The leads of the lead type electronic component 5 are connected to the conductive patterns 11 by a method such as soldering etc. The ground pattern is thereby electrically connected to the screw hole 4a in the printed-wiring board 2.

Moreover, the metal plate 3 is also formed with the screw hole 4b, and the screw hole 4a in the printed-wiring board 2 is connected to the screw hole 4b in the metal plate 3 with a screw (unillustrated) exhibiting the electric conductivity. With this structure, the ground pattern (unillustrated) on the printed-wiring board 2 is electrically connected to the metal plate 3 via the lead type electronic component 5.

Moreover, at the other end of the printed-wiring board 2, the printed-wiring plate 2, the metal plate 3 and the conductive member 1 of the box body are fixed through the non-conductive member 6 in the electrically non-conductive state.

With such a construction, the ground pattern on the printed-wiring board and the newly provided metal plate can be so structured as to be connected through a predetermined impedance.

In the eighth example, it is feasible to prevent the electric current from leaking out of connection pins required for packaging the electronic components such as the connector on the printed-wiring board.

In each of the examples of the first embodiment of the present invention, the ground pattern 7 on the printed-wiring board 2 is connected to the metal plate 3 with the predetermined impedance. This predetermined impedance is, however, a value equal or substantially equal to a characteristic impedance between the printed-wiring board 2 and the metal plate 3. The characteristic impedance between the printed-wiring board 2 and the metal plate 3 is a value determined corresponding to electric characteristics of the conductive member and the dielectric member of which the printed-wiring board 2 and the metal plate 3 are composed and to a relative position of the printed-wiring board 2 to the metal plate 3 in a state where the printed-wiring board 2 and the metal plate 3 are not electrically connected.

Therefore, the ground pattern 7 on the printed-wiring board 2 is connected to the metal plate through an impedance element of which a value is substantially equal to the characteristic impedance between the printed-wiring board 2 and the metal plate 3, thereby restraining an occurrence of the radiant noises from the electronic device by restricting the current component having a standing-wave frequency.

Further, the metal plate used in each example of the first embodiment of the present invention may be replaced with a sheet-like conductive member exhibiting a flexibility. Moreover, the printed-wiring board may be any one of a single- or double-side plate or a multi-layered substrate. Additionally, the printed-wiring board may be structured such that ground wiring patterns for a digital logic circuit and ground wiring patterns for an analog circuit may be arranged in mixture but in separation.

In the first embodiment of the present invention, it is preferable that the metal plate be disposed in the position facing to the printed-wiring board and on the side of the surface of the printed-wiring board mounted with no connector. Further, there may be also provided a plurality of metal plates in between the printed-wiring board is interposed, with their surfaces facing to each other.

As discussed above, in accordance with the first embodiment of the present invention, the metal plate having the size equal to the printed-wiring board and, as in the case of the printed-wiring board, insulated from the conductive member constituting the box body, is disposed in the position facing to the surface of the printed-wiring board. Further, the ground pattern on the printed-wiring board is connected to the metal plate through the connecting portion exhibiting a certain predetermined impedance, whereby the ground potential of the printed-wiring board is stabilized and the radiant noises caused by the standing waves can be restrained.

A second embodiment of the present invention will be next described.

Figure 12:
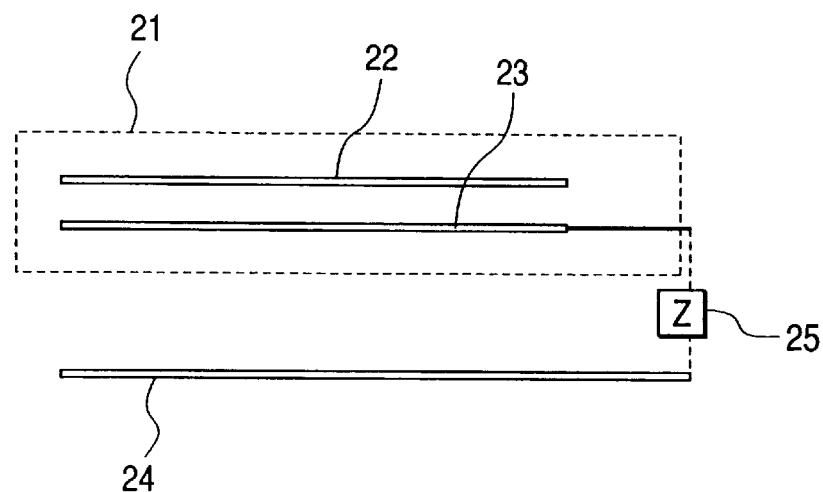
FIG. 12 is a schematic view showing a connecting relationship between a first conductive layer of the printed-wiring board and a second conductive layer within the electronic device in a second embodiment of the present invention.

FIG. 12 is a schematic diagram showing a connecting relationship between a first conductive layer and a second conductive layer of the printed-wiring board within the electronic device in the second embodiment of the present invention.

Referring to FIG. 12, a first conductive layer 21 contains a conductive pattern 22 for a digital signal and a conductive pattern 23 for GND which exist in mixture. On the other hand, a second conductive layer 24 is composed of a conductive member of which a plane area is equal to the printed-wiring board, and an insulating layer for insulation is interposed in between the respective conductive layers. Then, the second conductive layer 24 is connected to the GND conductive pattern 23 of the first conductive layer 21 through an electric element 25 exhibiting a predetermined impedance. The second conductive layer 24 is not electrically connected to a conductive pattern, e.g., the digital signal conductive pattern 22 excluding the GND conductive pattern 23 of the first conductive layer 21 by soldering and through an electric element.

Figure 13:
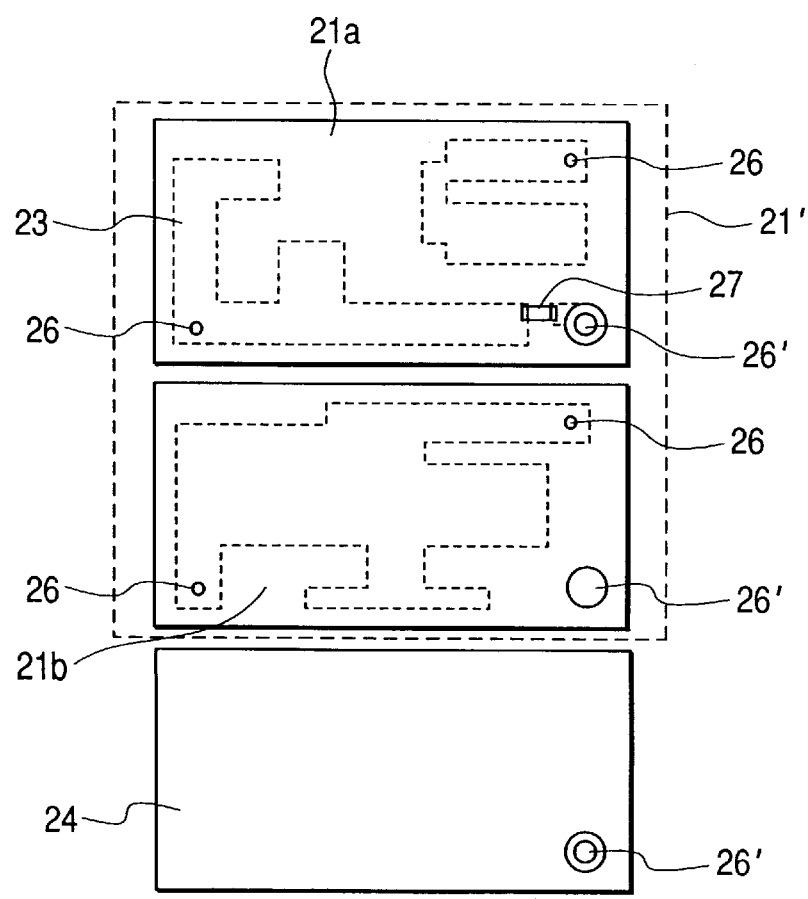
FIG. 13 is a plan view showing the first conductive layer of the printed-wiring board and the second conductive layer in a first example of the second embodiment of the present invention.

FIG. 13 shows a first example of the second embodiment of the present invention which is schematically shown in FIG. 12, and is a plan view illustrating the first conductive layer and the second conductive layer of the printed-wiring board incorporated into the electronic device.

FIG. 13 is a schematic top view showing the respective layers, assuming that the insulating layer is interposed in between the respective conductive layers. Referring again to FIG. 13, a first conductive layer group 21' is constructed of two pieces of first conductive layers 21a, 21b, and the GND conductive pattern 23 of each of the conductive layers 21a, 21b has the electric conductivity through a through-hole 26. Then, through-holes 26' for a mutual electric connection are formed in one ends of the GND conductive pattern 23 and of the second conductive layer 24. In the GND conductive pattern 23 of the first conductive layer group 21', a packaging land capable of being packaged with a chip type electronic component is provided just before the connection to this through-hole 26', and is mounted with, e.g., a chip type inductor component 27, and the connection is done by soldering.

Namely, the ground pattern of the first conductive layer 21 is connected to the second conductive layer 24 with a predetermined impedance.

The soldering connection in this example may also be replaced with an electric connection by a method such as using a conductive bonding agent. Further, the GND pattern of the first conductive layer group and the second conductive layer may be connected at an arbitrary portion on the printed-wiring board and may also be connected at a plurality of portions thereon. Moreover, in the case of the plurality of connections, impedances of the connecting portions may be different from each other.

Herein, in the first example of the second embodiment, the chip type inductor component is used, however, the through-hole land is provided, and the lead type electronic component may also be used.

Further, in addition to the first and second conductive layers, there may also be a conductive layer for a supply from a drive power source, and a conductive pattern through which the drive power source supplies the first and conductive layers with electricity. Moreover, the second conductive layer may include through-areas for mounting the lead type electronic component and the connector.

Figure 14:
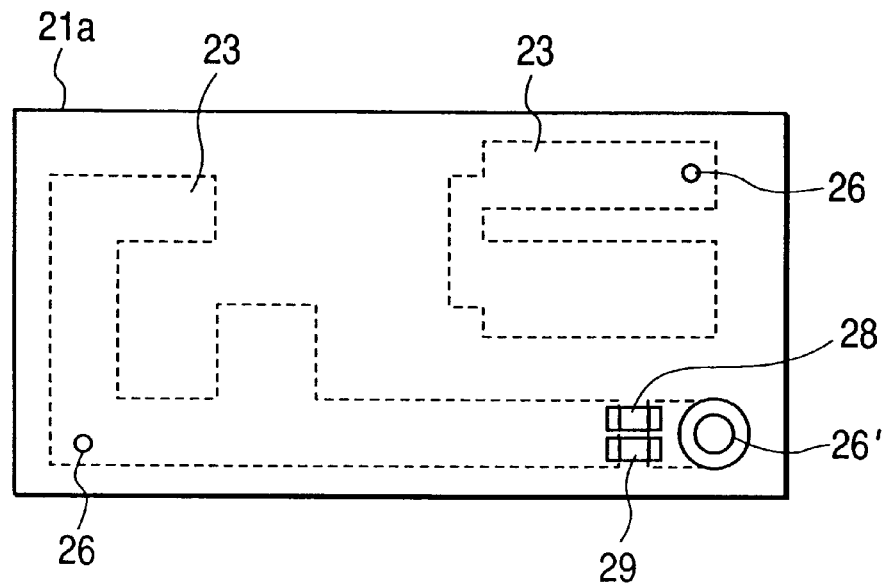
FIG. 14 is a plan view showing the first conductive layer of the printed-wiring board within the electronic device in a second example of the second embodiment of the present invention.

FIG. 14 shows a second example of the second embodiment of the present invention, and is a plan view illustrating the first conductive layer of the printed-wiring board within the electronic device.

The second example is a case where a part of the construction of the first example is modified. Referring to FIG. 14, the conductive layer 21a contains the conductive pattern 22 for the digital signal and the conductive pattern 23 for GND which exist in mixture, and the second conductive layer 24 is defined as a conductive member having a plane area equal to the printed-wiring board. The through-hole 26' for an electric connection to the second conductive layer 24 is formed in a part of the conductive layer 21a. A surface packaging land on which a chip type resistance component 28 and a chip type capacitor component 29 can be mounted in parallel, is provided between the through-hole 26' and the GND conductive pattern 23, and the GND conductive pattern 23 is connected to the general through-hole 26 by soldering (not shown).

With such a construction, the GND conductive pattern 23 of the first conductive layer can be connected to the second conductive layer 24 through the predetermined resistive and capacitive impedances.

Herein, according to the second example of the second embodiment, the connection is made by the chip type resistance component 28 and the chip type capacitor component 29 through the impedance, however, the inductor components etc. may also be used. There may also be a composite component of any one of combinations of the resistive, inductance and capacitive properties.

Figure 15:
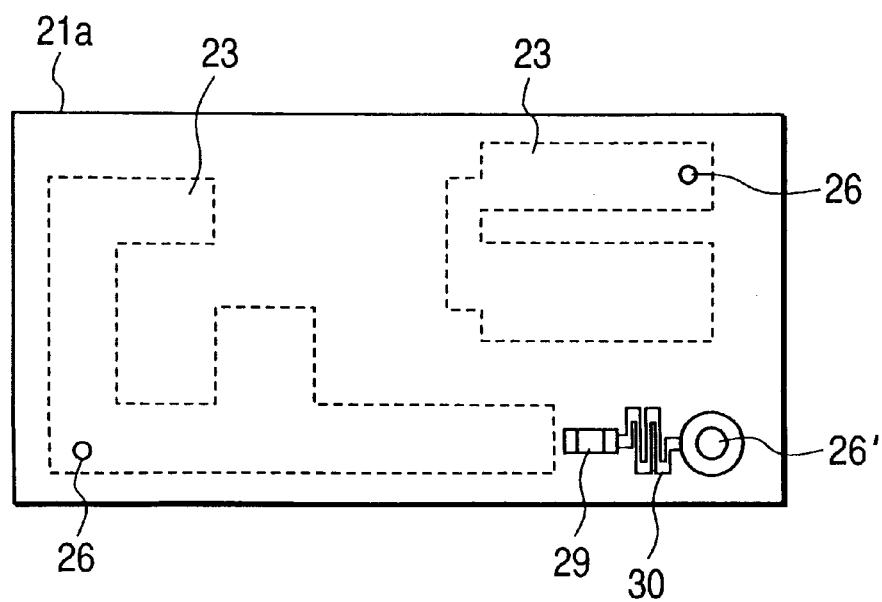
FIG. 15 is a plan view showing the first conductive layer of the printed-wiring board within the electronic device in a third example of the second embodiment of the present invention.
Figure 16:
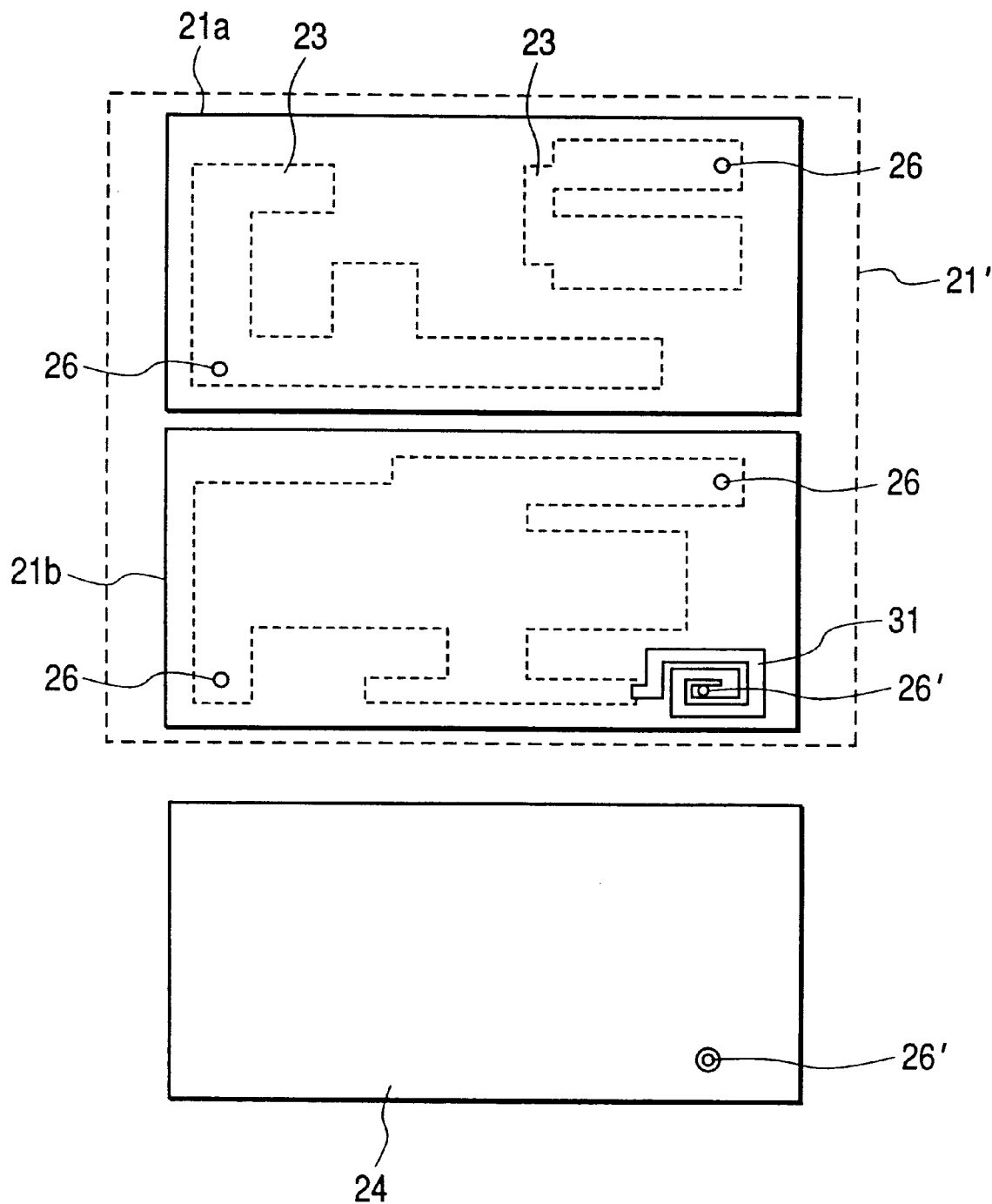
FIG. 16 is a plan view showing the first conductive layer of the printed-wiring board and the second conductive layer within the electronic device in a modification of the third example of the second embodiment of the present invention.

FIG. 15 shows a third example of the second embodiment of the present invention, and is a plan view illustrating the first conductive layer of the printed-wiring board within the electronic device. FIG. 16 shows a modification of the third example of the second embodiment of the present invention shown in FIG. 15, and is a plan view illustrating the first conductive layer of the printed-wiring board within the electronic device.

Referring to FIGS. 15 and 16, the conductive layer 21a contains the conductive pattern 22 for the digital signal and the conductive pattern 23 for GND which exist in mixture, and the second conductive layer 24 is defined as a conductive member having a plane area equal to the printed-wiring board. The through-hole 26' for an electric connection to the second conductive layer 24 is formed in a part of the conductive layer 21a. A crooked pattern inductor 30 exhibiting an inductance property, into which the conductor pattern is formed in a crooked configuration, and the chip type capacitor component 29 are disposed in series and electrically connected by soldering (not shown) between the through-hole 26' and the GND conductive pattern 23.

With such a construction, the GND conductive pattern 23 provided on the first conductive layer 21a can be connected to the second conductive layer 24 with a predetermined impedance which can be constructed of a series circuit of the inductance properties and the capacitive properties.

Herein, the third example of the second embodiment involves the use of the crooked pattern inductor 30 exhibiting the inductance property, however, a spiral pattern inductor 31 as shown in FIG. 16 may also be used by way of a modification of the third example.

Figure 17:
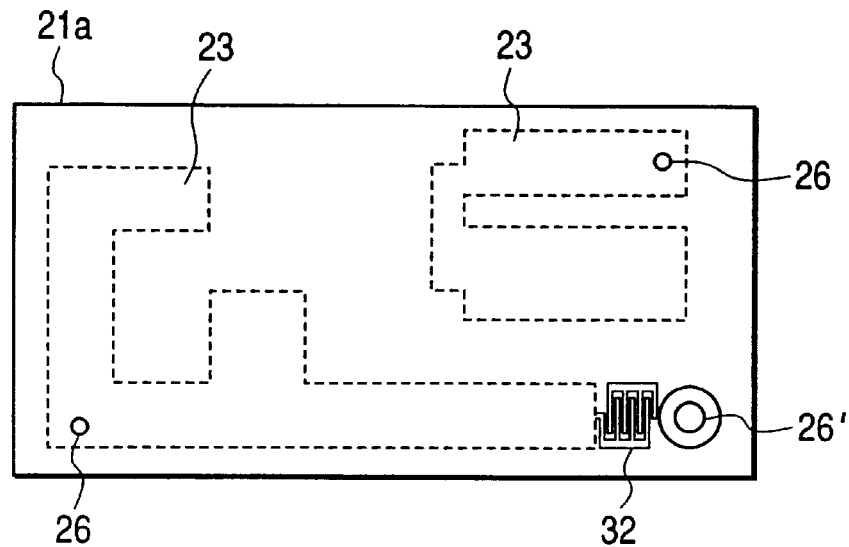
FIG. 17 is a plan view showing the first conductive layer of the printed-wiring board within the electronic device in a fourth example of the second embodiment of the present invention.

FIG. 17 shows a fourth example of the second embodiment of the present invention, and is a plan view illustrating the first conductive layer of the printed-wiring board within the electronic device. Referring to FIG. 17, the conductive layer 21a contains the conductive pattern 22 (unillustrated) for the digital signal and the conductive pattern 23 for GND which exist in mixture, and the second conductive layer 24 is defined as a conductive member having a plane area equal to the printed-wiring board. The through-hole 26' for an electric connection to the second conductive layer 23 is formed in a part of the conductive layer 21a. The through-hole 26' and the GND conductive pattern 23 is electrically connected to each other via a comb-like pattern capacitor 32 exhibiting a capacitive property, which is obtained by forming the conductive pattern in a comb-like configuration.

With such a construction, the GND conductive pattern provided on the first conductive layer can be connected to the second conductive layer with the capacitive properties.

Figure 18:
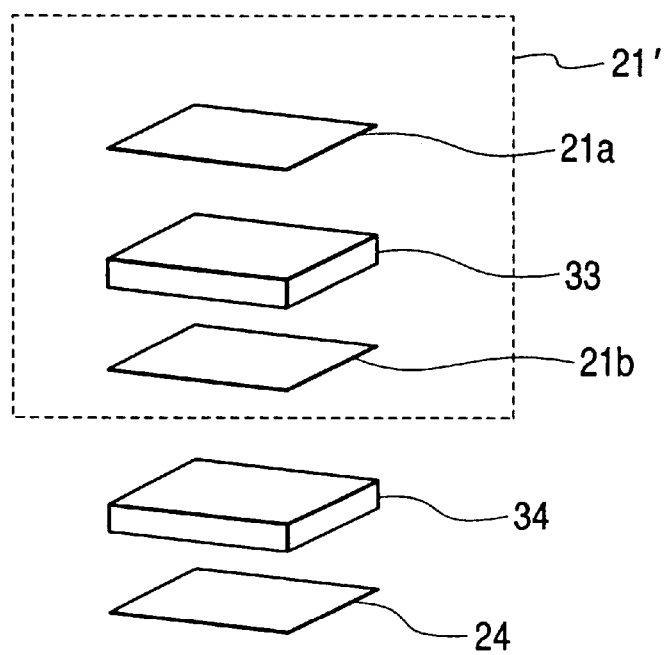
FIG. 18 is a plan view schematically showing respective conductive layers of the printed-wiring board within the electronic device in a fifth example of the second embodiment of the present invention.

FIG. 18 shows a fifth example of the second embodiment of the present invention, and is a perspective view schematically illustrating respective conductive layers of the printed-wiring board within the electronic device.

Referring to FIG. 18, a first conductive layer group 21' is composed of conductive layers 21a, 21b containing the conductive pattern for the digital signal and the conductive pattern for GND which exist in mixture, and a dielectric layer 33 provided between the conductive layers 21a and 21b. On the other hand, the second conductive layer 24 is composed of a conductive member having a plane area equal to the printed-wiring board. A mixture layer 34 of a dielectric substance and a magnetic substance is provided between the first conductive layer group 21' and the second conductive layer 24. Then, the second conductive layer 24 is connected to the GND pattern of the first conductive layer group 21' through an electric element 25 having an impedance. A conductive pattern, e.g., the conductive pattern 22 for the digital signal excluding the GND pattern 23 of the first conductive layer, is not electrically connected to the second conductive layer 24 by soldering or through the electric element.

With the construction described above, an unnecessary current flowing across the GND conductive pattern 23 of the first conductive layer can be absorbed by the magnetic substance between the second conductive layer 24 and the first conductive layer, whereby unnecessary electromagnetic waves can be restrained.

Figure 19:
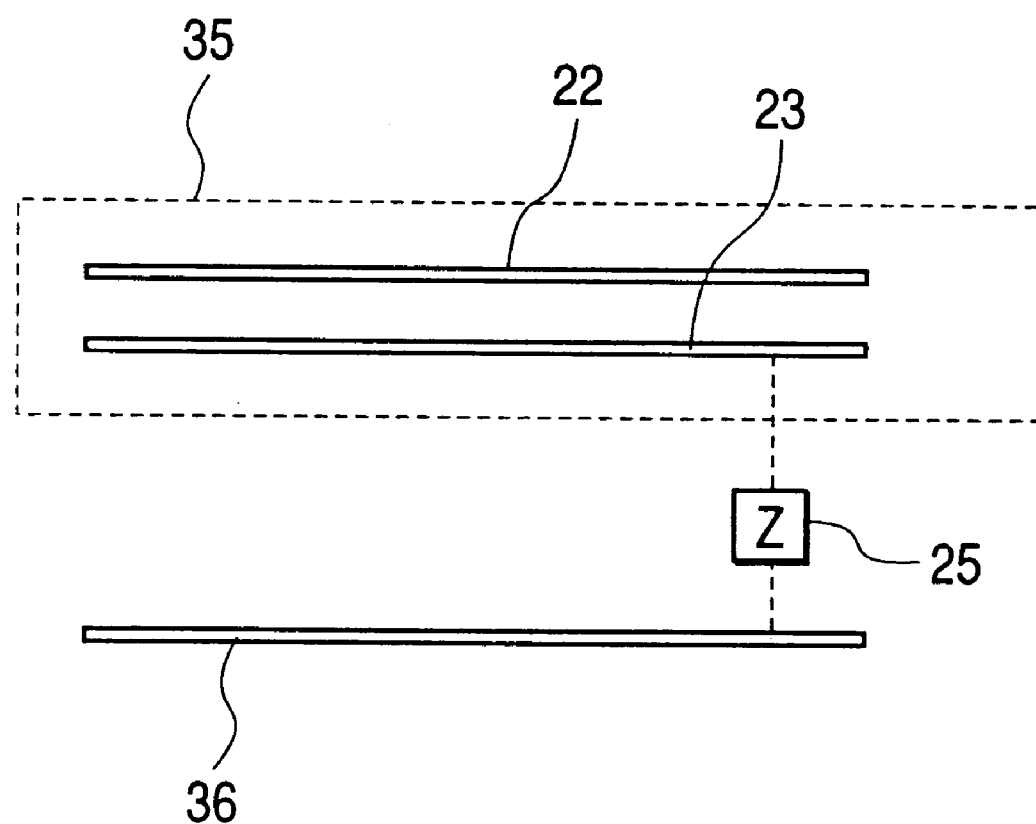
FIG. 19 is a schematic view showing a connecting relationship between the first conductive layer of the printed-wiring board and the second conductive layer within the electronic device in a sixth example of the second embodiment of the present invention.
Figure 20:
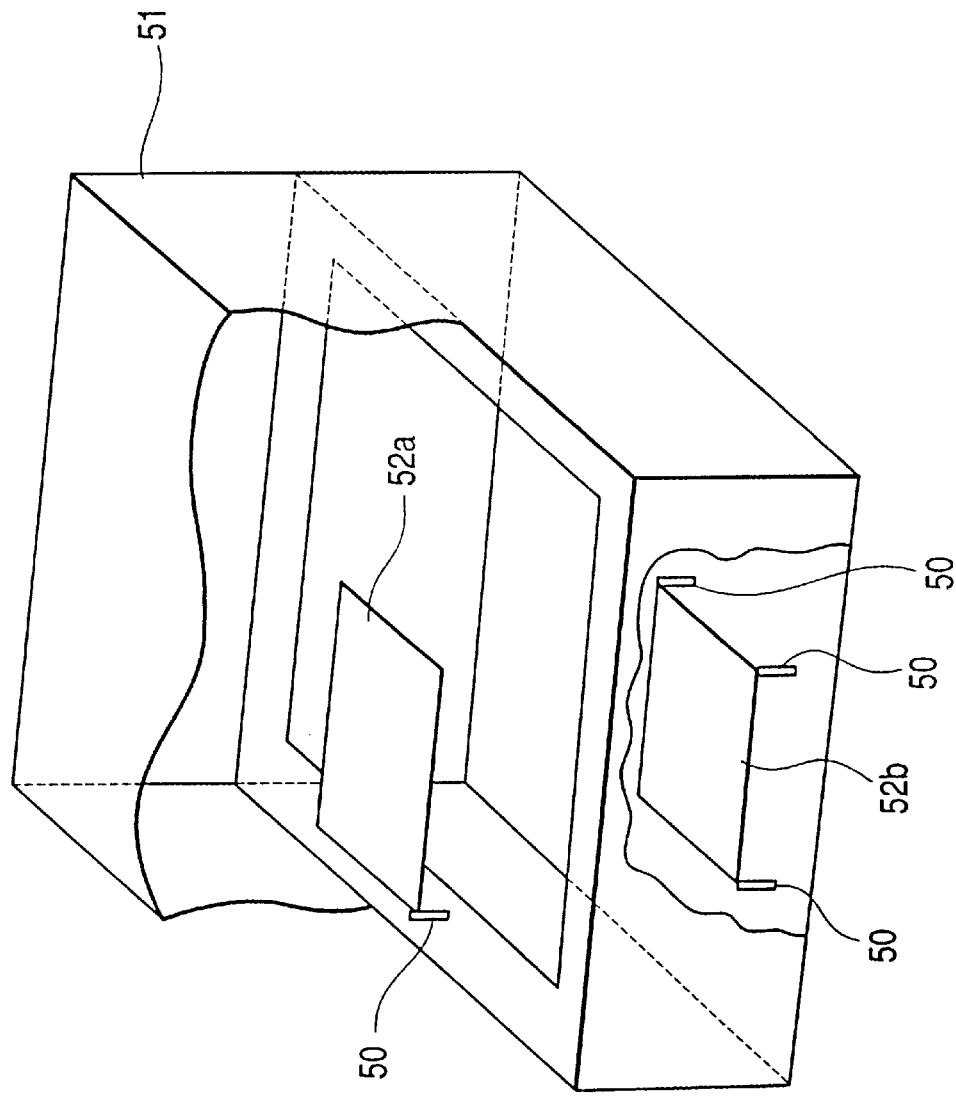
FIG. 20 is a plan view showing a connecting relationship between a printed-wiring board and a box body in the prior art.

FIG. 19 shows a sixth example of the second embodiment of the present invention, and is a schematic view showing a connecting relationship between the first conductive layer and the second conductive layer of the printed-wiring board within the electronic device.

Referring to FIG. 19, the printed-wiring board, of which a layer configuration is conceptually illustrated, is manufactured by a build-up method. A first conductive layer 35 is laminated by the build-up method and contains the conductive pattern 22 for the digital signal and the conductive pattern 23 for GND which exist in mixture, and a second conductive layer 36 is classified as a printed board having a plane area equal to the printed-wiring board and manufactured by press molding. Then, the GND conductive pattern 23 of the first conductive layer 35 is connected to the second conductive layer 36 through the electric element 25 having a predetermined impedance. A conductive pattern, e.g., the conductive pattern 22 for the digital signal excluding the GND pattern 23 of the first conductive layer 35, is not electrically connected to the second conductive layer 36 by soldering or through the electric element.

With the construction described above, the wires for the digital signal etc. are formed on the build-up layer, and can be therefore arranged with a high density, and the unnecessary radiant noises can be restrained.

In each of the examples of the second embodiment of the present invention, the ground pattern 23 on the first conductive layer 21 of the printed-wiring board is connected to the second conductive layer 24 with the predetermined impedance. This predetermined impedance is, however, a value equal or substantially equal to a characteristic impedance between the first conductive layer 21 and the second conductive layer 24. The characteristic impedance between the first conductive layer 21 and the second conductive layer 24 is a value determined corresponding to electric characteristics of the conductive member and the dielectric member of which the first conductive layer 21 and the second conductive layer 24 are composed and to a relative position of the first conductive layer 21 to the second conductive layer 24 in a state where the first conductive layer 21 is not electrically connected to the second conductive layer 24.

Therefore, the first conductive layer 21 is connected to the second conductive layer 24 through the impedance element of which a value is substantially equal to the characteristic impedance between the first conductive layer 21 and the second conductive layer 24, thereby restraining the occurrence of the radiant noises from the electronic device by restricting the current component having the standing-wave frequency.

As discussed above, according to the second embodiment of the present invention, as the conductive layers constituting the multi-layered printed-wiring board, there are provided the first conductive layer containing in mixture the conductive pattern for the signal of the digital logic circuit and the conductive pattern for the ground, and the second conductive layer composed of the conductive member of which the plane area is equal to the printed-wiring board, with the insulating layer interposed therebetween. The conductive layer exclusive of the GND conductive pattern of the first conductive layer is not electrically connected to the second conductive layer, and the GND conductive pattern of the first conductive layer is electrically connected to the second conductive layer through the circuit element having the impedance. Hence, it is feasible to provide the multi-layered printed-wiring board having the structure for stabilizing the GND potential of the printed-wiring board and restraining the radiant noises caused by the standing-waves, and also the electronic device including this printed-wiring board.

The many features and advantages of the invention are apparent from the detailed specification and, thus, it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. An electronic device having a printed-wiring board, comprising:

an electronic device housing constructed of a conductive member;

a printed-wiring board provided within said electronic device housing, and including a ground pattern;

a metal plate disposed in a position facing to said printed-wiring board within said electronic device housing, and having a size equal to or larger than said printed-wiring board, said metal plate not being electrically conductive to said conductive member constituting said electronic device housing, and having a characteristic impedance corresponding to an electric characteristic and a relative position to said printed-wiring board; and connecting means, for electrically connecting the ground pattern of said printed-wiring board to said metal plate, including an impedance element having a value substantially equal to the characteristic impedance between said printed-wiring board and said metal plate.

2. An electronic device having a printed-wiring board according to claim 1, wherein said connecting means includes a screw serving to connect said printed-wiring board to said metal plate, and exhibiting an electric conduction.

3. An electronic device having a printed-wiring board according to claim 2, wherein said connecting means includes a first screw hole, formed in said printed-wiring board, into which the screw is screwed, a second screw hole, formed in said metal plate, into which the screw is screwed, and a conductive pattern for a connection, disposed between the ground pattern of said printed-wiring board and said first screw hole.

4. An electronic device having a printed-wiring board according to claim 1, wherein said impedance element is composed of a circuit element or a group of circuit elements.

5. An electronic device having a printed-wiring board according to claim 4, wherein said circuit element or said circuit element group is composed of solely or a combination of a resistivity, a capacitive property and a inductance property.

6. An electronic device having a printed-wiring board according to claim 4, wherein said circuit element group is constructed of a resistive element and a capacitive element which are connected in series.

7. An electronic device having a printed-wiring board according to claim 4, wherein said circuit element group is constructed of a resistive element and a conductive pattern assuming a crooked configuration and exhibiting an inductance property, which are connected in parallel.

8. An electronic device having a printed-wiring board according to claim 4, wherein said circuit element group is constructed of a resistive element and a conductive pattern assuming a spiral configuration and exhibiting an inductance property, which are connected in parallel.

9. An electronic device having a printed-wiring board according to claim 4, wherein said circuit element group is constructed of a resistive element and a conductive pattern assuming a comb-like configuration and exhibiting a capacitive property, which are connected in parallel.

10. An electronic device having a printed-wiring board according to claim 1, wherein a plurality of printed-wiring boards are provided, and if said plurality of printed-wiring boards are connected to each other through a connecting member, said metal plate has a size equal to or larger than an area embracing said plurality of printed-wiring boards and said connecting member.

11. An electronic device having a printed-wiring board according to claim 10, wherein said connecting member is a cable for electrically connecting said plurality of printed-wiring boards to each other.

12. An electronic device having a printed-wiring board according to claim 10, wherein said connecting member is a connector for electrically connecting said plurality of printed-wiring boards to each other.

13. An electronic device having a printed-wiring board according to claim 1, wherein said metal plate is covered with a dielectric member.

14. An electronic device having a printed-wiring board, comprising:

an electronic device housing composed of a conductive member;

a printed-wiring board, provided within said electronic device housing, of which the vicinity has no existence of a conductive member having a size enough to constitute said electronic device housing, said printed-wiring board having a ground pattern;

a conductive sheet provided in a position facing to said printed-wiring board within said electronic device housing, and having a size equal to or larger than said printed-wiring board, said conductive sheet not being electrically conductive to said conductive member constituting said electronic device housing, and having a characteristic impedance corresponding to an electric characteristic and a relative position to said printed-wiring board; and connecting means, for electrically connecting the ground pattern of said printed-wiring board to said conductive sheet, including an impedance element having a value substantially equal to the characteristic impedance between said printed-wiring board and said conductive sheet.

15. An electronic device having a printed-wiring board, comprising:

an electronic device housing composed of a conductive member;

a printed-wiring board, provided within said electronic device housing, said printed-wiring board including:

(a) a first conductive layer having a conductive pattern for a signal and a ground pattern;

(b) a second conductive layer having a conductive member of which an areal size is substantially equal to said first conductive layer, and a characteristic impedance corresponding to an electric characteristic and a relative position to said first conductive layer;

(c) an insulating layer provided between said first conductive layer and said second conductive layer; and (d) connecting means, for electrically connecting said first conductive layer and said second conductive layer to each other, including an impedance element having a value substantially equal to a characteristic impedance between said first conductive layer and said second conductive layer.

16. A printed-wiring board, comprising:

a first conductive layer having a conductive pattern for a signal and a ground pattern;

a second conductive layer having a conductive member of which an areal size is substantially equal to said first conductive layer, and a characteristic impedance corresponding to an electric characteristic and a relative position to said first conductive layer;

an insulating layer provided between said first conductive layer and said second conductive layer; and connecting means, for electrically connecting said first conductive layer and said second conductive layer to each other, including an impedance element having a value substantially equal to a characteristic impedance between said first conductive layer and said second conductive layer.

17. A printed-wiring board according to claim 16, wherein said connecting means has a through-hole penetrating said first conductive layer, said insulating layer and said second conductive layer.

18. A printed-wiring board according to claim 16, wherein said impedance element is composed of a circuit element or a group of circuit elements.

19. A printed-wiring board according to claim 18, wherein said circuit element or said circuit element group is composed of solely or a combination of a resistivity, a capacitive property and a inductance property.

20. A printed-wiring board according to claim 18, wherein said circuit element group is constructed of a resistive element and a capacitive element which are connected in series.

21. A printed-wiring board according to claim 18, wherein said circuit element group is constructed of a resistive element and a conductive pattern assuming a crooked configuration and exhibiting an inductance property, which are connected in parallel.

22. A printed-wiring board according to claim 18, wherein said circuit element group is constructed of a resistive element and a conductive pattern assuming a spiral configuration and exhibiting an inductance property, which are connected in parallel.

23. A printed-wiring board according to claim 18, wherein said circuit element group is constructed of a resistive element and a conductive pattern assuming a comb-like configuration and exhibiting a capacitive property, which are connected in parallel.

24. A printed-wiring board according to claim 16, wherein said first conductive layer includes a plurality of conductive layers containing a conductive pattern for a signal of a digital logic circuit and a ground pattern which exist in mixture, and an insulating member is interposed between said plurality of conductive layers, thus forming a first conductive layer group.

* * * * *